United States Patent
Lemmens (10) Patent No.: US 9,225,312 B2
(45) Date of Patent: *Dec. 29, 2015

(54) ELECTROMAGNETIC INTERFERENCE SUPPRESSION

(71) Applicant: Access Business Group International LLC, Ada, MI (US)

(72) Inventor: Willy Henri Lemmens, Heverlee (BE)

(73) Assignee: Access Business Group International LLC, Ada, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 14/507,259

(22) Filed: Oct. 6, 2014

(65) Prior Publication Data

US 2015/0022023 A1 Jan. 22, 2015

Related U.S. Application Data

(62) Division of application No. 12/561,535, filed on Sep. 17, 2009, now Pat. No. 8,878,392.

(30) Foreign Application Priority Data

Sep. 18, 2008 (GB) .................................. 0817047.4

(51) Int. Cl.
*H02J 5/00* (2006.01)
*H03H 7/01* (2006.01)
(Continued)

(52) U.S. Cl.
CPC ............. *H03H 7/0123* (2013.01); *H01F 38/14* (2013.01); *H02J 5/005* (2013.01); *H02M 1/44* (2013.01)

(58) Field of Classification Search
CPC ...................................................... H02J 5/005
USPC .................. 307/89–91, 104; 320/108; 363/47
See application file for complete search history.

(56) References Cited

U.S. PATENT DOCUMENTS 5,198,647 A 3/1993 Mizuta
5,457,378 A 10/1995 Woody
(Continued)

FOREIGN PATENT DOCUMENTS

WO 2006/106481 10/2006

OTHER PUBLICATIONS

Lewallen, Roy W., "Baluns: What they do and how they do it", ARRL Antenna Compendium, vol. 1, 1985, pp. 157-166; p. 159; pp. 162-163.

(Continued)

*Primary Examiner* — Fritz M Fleming
(74) *Attorney, Agent, or Firm* — Warner Norcross & Judd LLP (57) ABSTRACT

An inductive power transmitter for transmitting electrical power to a device by electromagnetic induction, the transmitter being configured to receive power conductively by way of a current via an electrical conduit from an external power source, the transmitter including a field generator configured to generate a fluctuating electromagnetic field having a fundamental frequency; and at least one impedance element connected along an electrical path of the transmitter configured to carry said current, the impedance element or a combination of the impedance elements having a high enough impedance at the fundamental frequency such that, in use, electromagnetic noise experienced at the power source is substantially suppressed, such noise arising from coupling between the electromagnetic field and a circuit having said path and linking the power source to the transmitter.

20 Claims, 11 Drawing Sheets

(51) Int. Cl.
  *H02M 1/44*  (2007.01)
  *H01F 38/14* (2006.01)

(56) References Cited

U.S. PATENT DOCUMENTS

| | | |
|---|---|---|
| 6,501,364 B1 | 12/2002 | Hui et al. |
| 6,522,129 B2 | 2/2003 | Miyata et al. |
| 6,580,183 B2 | 6/2003 | Watanabe et al. |
| 6,768,226 B2 | 7/2004 | Watanabe et al. |
| 6,864,419 B2 | 3/2005 | Lovens |
| 6,888,438 B2 | 5/2005 | Hui et al. |
| 7,009,482 B2 | 3/2006 | Kiko et al. |
| 7,084,728 B2 | 8/2006 | Hyvonen |
| 7,443,135 B2 | 10/2008 | Cho |
| 8,878,392 B2 * | 11/2014 | Lemmens .................. 307/104 |
| 2003/0127913 A1 | 7/2003 | Roberts, Jr. et al. |
| 2008/0136516 A1 | 6/2008 | Afsahi |
| 2009/0251102 A1 | 10/2009 | Hui |
| 2009/0267558 A1 | 10/2009 | Jung |
| 2010/0109604 A1 | 5/2010 | Boys et al. |

OTHER PUBLICATIONS

International Search Report and the Written Opinion of the International Searching Authority, dated Feb. 15, 2010, in Application No. PCT/EP2009/058329.

* cited by examiner

ELECTROMAGNETIC INTERFERENCE SUPPRESSION

BACKGROUND

The present invention relates to inductive power transmitters, electrical conduits therefor, related equipment and related methods.

It is desirable for electronic devices to meet electromagnetic compatibility (EMC) regulations. By way of example, one European such regulation is referred to as EN55011:1998 together with A1:1999 (denoting an EU standard plus an amendment thereto), and one American such regulation is referred to as ANSI C63.4-2001 (denoting a US standard). One part of such regulations, or the like, governs unwanted signals (so-called "conducted emissions") that may be conducted back into a mains supply. Wireless transmitting devices deliberately emit radiation and it is desirable to ensure that this radiation (or spurious tones thereof) is not picked up by the mains cable and conducted back into the mains supply.

Devices, such as inductive power transmitters, designed to transmit power wirelessly to portable electrical or electronic devices (or equipment used in the vicinity thereof) can be especially prone to pick-up in their mains cables. The fundamental frequency of electromagnetic fields generated by such transmitters is generally lower than that of data transmitters, but the power transmitted is generally higher. Such transmitters may generate relatively high magnetic fields in the vicinity of their mains cables. Furthermore, nonlinearities present in the system (e.g. in the rectification circuitry within the portable device itself) can result in harmonics and other spurious tones, which exacerbate the problem.

One way to mitigate this problem is to use shielded mains cable. However, shielded cable is expensive and its use may be prohibitively expensive for low-cost consumer applications.

SUMMARY

According to an embodiment of a first aspect of the present invention, there is provided an inductive power transmitter for transmitting electrical power to an electrical or electronic device by electromagnetic induction, the transmitter being configured to receive power conductively by way of a current via an electrical conduit from an external power source, the transmitter having: a field generator configured to generate a fluctuating electromagnetic field having a fundamental frequency; and at least one impedance element connected along an electrical path of the transmitter configured to carry the current, wherein: the impedance element or a combination of the impedance elements has a high enough impedance at the fundamental frequency such that, in use, electromagnetic noise experienced at the power source is substantially suppressed, such noise arising from coupling between the electromagnetic field and a circuit having the path and linking the power source to the transmitter.

Such suppression may be considered substantial, for example, if a noise voltage experienced at the power source is below a certain threshold, or if a particular EMC regulation or the like is satisfied.

The impedance element or a combination of the impedance elements may have a high enough impedance at the fundamental frequency such that a voltage induced by the electromagnetic field in a circuit linking the power source and the field generator and having the path is predominantly, or substantially, dropped across that impedance.

Such a transmitter may advantageously mitigate the potential effect of noise due to the generated electromagnetic field conducting back into the power source. That is, such a transmitter may reduce the magnitude of such noise signals experienced at the power source.

The electrical or electronic devices may be portable such devices, for example portable telephones, PDAs, computers, and the like. The electrical conduit may be a wire or a plurality of wires, for example provided as a cable such as a power cable.

The fundamental frequency may be a first fundamental frequency, and the current may have a second fundamental frequency different from the first fundamental frequency. The second fundamental frequency may be zero Hertz, representing a DC current, or have a non-zero magnitude. The impedance element or a combination of the impedance elements may have a low enough impedance at the second fundamental frequency such that the power is predominantly conveyed to the field generator without loss in that impedance. Such a transmitter may advantageously mitigate the potential effect of noise due to the generated electromagnetic field conducting back into the power source, while also not substantially affecting power transmission to the transmitter.

The current may be an AC current, for example a mains AC current. The power source may be a mains power source, for example a wall socket.

The or each element may have or be an inductance, for example in the form of a discrete or distributed inductor. The or each element may have additional components beyond such an inductor.

The transmitter may have the conduit, for example as a permanent component thereof or as a temporary attachment. The or at least one of the elements may be part of the conduit. The or all of the elements may be part of the conduit.

The transmitter may have a main body, for example a casing or the like, and the conduit may extend externally therefrom when in use. The or at least one of the elements may be located within the main body. The or all of the elements may be located within the main body. The conduit may be detachable from a part of the transmitter, for example from such a main body.

The or at least one of the elements may be shielded from the electromagnetic field. For example, each such element may have a dedicated shield, such as a metallic casing. One or more of the elements may be shielded by way of shielding provided in common to a plurality of components of the transmitter. A main body or casing of the transmitter may provide such shielding. Such shielding may be integral to the element as purchased from a supplier of such elements.

The transmitter may have two such elements, and the current may be carried along outbound and return connections (in the case of a fluctuating current, as apposed to a DC current, such connections may be referred to more generally as first and second connections). The elements may be located along different connections from one another. The elements may be located along the same connection as one another.

The transmitter may have two such elements, and those elements may each have or be an inductor. Those inductors may be configured to have opposite orientations relative to one another such that coupling from the field generator by way of the electromagnetic field to one inductor cancels out such coupling to the other inductor. Those inductors may be arranged such that there is substantially no mutual coupling between them.

A filter may be located between the conduit and the field generating means and configured to substantially block frequency components at the fundamental frequency of the electromagnetic field. Such a filter may advantageously reduce an amount of noise being conducted from within the transmitter to the power source.

The conduit may be a conductor, a wire, a lead, or a cable such as a mains cable.

According to an embodiment of a second aspect of the present invention, there is provided an electrical conduit configured to convey power conductively by way of a current from a power source to a field generator of an inductive power transmitter, the field generator being operable to generate a fluctuating electromagnetic field having a fundamental frequency for transmitting electrical power to an electrical or electronic device by electromagnetic induction, the conduit having: at least one impedance element connected along an electrical path of the conduit configured to carry the current, wherein: the impedance element or a combination of the impedance elements has a high enough impedance at the fundamental frequency such that, in use, electromagnetic noise experienced at the power source is substantially suppressed, such noise arising from coupling between the electromagnetic field and a circuit having the path and linking the power source to the transmitter.

The impedance element or a combination of the impedance elements may have a high enough impedance at the fundamental frequency such that a voltage induced by the electromagnetic field in a circuit linking the power source and the field generator and having the path is predominantly dropped across that impedance.

Such an electrical conduit, such as a cable, may advantageously mitigate the potential effect of noise due to the generated electromagnetic field conducting back into the power source. That is, such a conduit may be advantageously used with an inductive transmitter to reduce the magnitude of such noise signals experienced at the power source.

The fundamental frequency may be a first fundamental frequency, and the current may have a second fundamental frequency different from the first fundamental frequency. The second fundamental frequency may be zero Hertz, representing a DC current, or have a non-zero magnitude. The impedance element or a combination of the impedance elements may have a low enough impedance at the second fundamental frequency such that the power is predominantly conveyed to the field generator without loss in that impedance.

Such a conduit, such as a cable, may advantageously mitigate the potential effect of noise due to the generated electromagnetic field conducting back into the power source, while also not substantially affecting power transmission to the transmitter.

The conduit may be a conductor, a wire, a lead, or a cable such as a mains cable.

According to an embodiment of a third aspect of the present invention, there is provided equipment for use in the vicinity of an inductive power transmitter, the transmitter being for transmitting electrical power to an electrical or electronic device by electromagnetic induction and having a field generator configured to generate a fluctuating electromagnetic field having a fundamental frequency, the equipment being configured to receive power conductively by way of a current via an electrical conduit from an external power source, the equipment having: at least one impedance element connected along an electrical path of the equipment configured to carry the current, wherein: the impedance element or a combination of the impedance elements has a high enough impedance at the fundamental frequency such that, in use, electromagnetic noise experienced at the power source is substantially suppressed, such noise arising from coupling between the electromagnetic field and a circuit having the path and linking the power source to the equipment.

The impedance element or a combination of the impedance elements may have a high enough impedance at the fundamental frequency such that a voltage induced by the electromagnetic field in a circuit linking the power source and the field generator and having the path is predominantly dropped across that impedance.

The invention extends to method aspects corresponding respectively to the above-mentioned first to third aspects.

For example, according to an embodiment of a fourth aspect of the present invention, there is provided a method of configuring an inductive power transmitter, the transmitter being for transmitting electrical power to an electrical or electronic device by electromagnetic induction and being configured to receive power conductively via an electrical conduit by way of a current from an external power source, the transmitter having a field generator configured to generate a fluctuating electromagnetic field having a fundamental frequency, the method involving: connecting at least one impedance element along an electrical path of the transmitter configured to carry the current, wherein: the impedance element or a combination of the impedance elements has a high enough impedance at the fundamental frequency such that, in use, electromagnetic noise experienced at the power source is substantially suppressed, such noise arising from coupling between the electromagnetic field and a circuit having the path and linking the power source to the transmitter.

The present invention may extend to a kit, having a transmitter according to the aforementioned first aspect of the present invention, or equipment according to the aforementioned third aspect of the present invention, and such a conduit. Embodiments of the present invention may be supplied in such kit form.

According to a fifth aspect of the invention there is provided a wireless power transmitter, the transmitter comprising: at least one field generator, for generating an electromagnetic field at a first frequency; a power cable, for conveying electrical power at a second frequency from an external power source to the field generator; wherein the electromagnetic field generated is able to couple to the power cable; at least one element electrically connected to the power cable and the at least one field generator; wherein the element has a relatively high impedance at the first frequency and a relatively low impedance at the second frequency, such that power is adequately conveyed along the power cable at the second frequency, but electromagnetic energy at the first frequency coupled to the power cable is prevented to some extent from reaching the external power source.

This aspect may have the advantage that it reduces the amount of electromagnetic energy which is conducted back through the power cable to the power source, thereby reducing the electromagnetic interference.

There may be means to prevent the electromagnetic field coupling to the element. The element may be surrounded by an electromagnetic shield, for example a metal case. The first frequency may be higher than the second frequency. The at least one element may be an inductor. The inductor may be split into a first portion and a second portion, with the first and second portions aligned so that the electromagnetic field couples substantially equally to the first and second portions, but connected electrically such that voltage induced in the first portion opposes the voltage induced in the second portion. The first and second portions may be arranged such that there is little or substantially zero mutual coupling between them. The second frequency may be zero, that is direct current. The element or elements may be in the live, neutral or both live and neutral lines in an AC mains power cable. The element or elements may be interposed between the power cable and the field generator. The field generator may generate other frequencies in addition to the first frequency, for example harmonics.

There may be a first inductor in a first power line and a second inductor in a second power line, wherein the first and second inductors are aligned so that the electromagnetic field couples substantially equally to the first and second inductors, but connected electrically such that voltage induced in the first inductor opposes the voltage induced in the second inductor.

The first and second inductors may be arranged such that there is little or substantially zero mutual coupling between them.

According to a sixth aspect of the invention there is provided a system for transferring power wirelessly from a transmitter to a device, separable from the transmitter, the system comprising: a transmitter generating an electromagnetic field at a first frequency; a device with a power receiver; such that when the device is placed in proximity to the transmitter, the power receiver couples to the electromagnetic field, such that power is transferred from the transmitter to the device; a power cable, for conveying electrical power at a second frequency from an external power source to the transmitter; wherein the electromagnetic field generated is able to couple to the power cable; at least one element electrically connected to the power cable and the transmitter; wherein the element has a relatively high impedance at the first frequency and a relatively low impedance at the second frequency, such that power is adequately conveyed along the power cable at the second frequency, but electromagnetic energy at the first frequency coupled to the power cable is prevented to some extent from reaching the external power source.

The element may be external or internal to the transmitter. The element may be either side of the power cable.

According to a seventh aspect of the invention there is provided a method for reducing the electromagnetic interference effects from a wireless power transmitter, the method comprising the steps of: generating an electromagnetic field from a transmitter at a first frequency; supplying power along a power cable from a power source to the transmitter at a second frequency; coupling taking place between the electromagnetic field generated and the power cable; providing an element with a relatively high impedance at the first frequency and a relatively low impedance at the second frequency to reduce the energy at the second frequency being conducted along the power cable to the power source.

FURTHER DESCRIPTION OF THE CURRENT EMBODIMENTS

Figure 1:
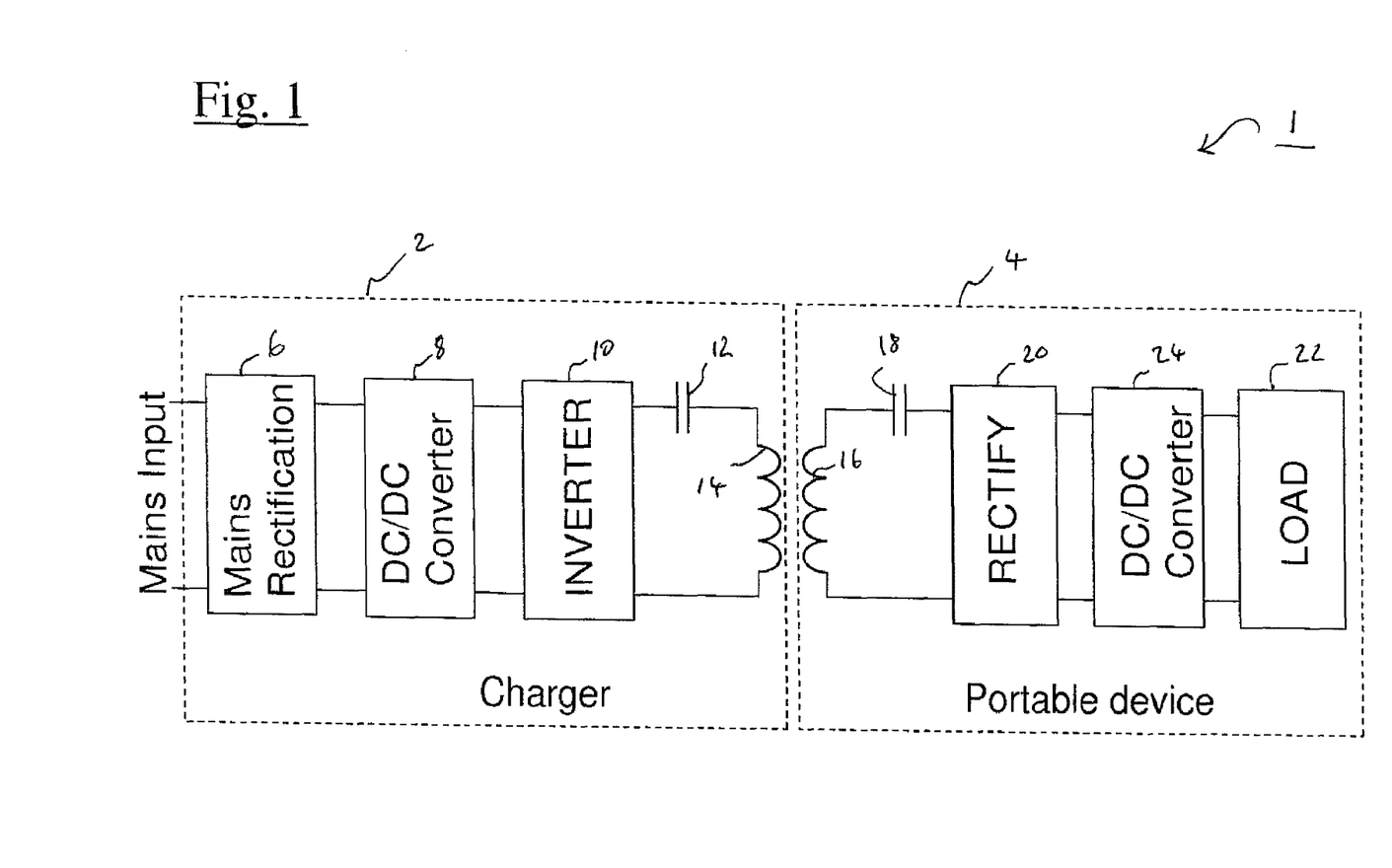
FIG. 1 is a schematic diagram of a previously-considered wireless charging system.

By way of introduction, FIG. 1 is a schematic diagram of a previously-considered wireless charging system 1. The FIG. 1 system comprises a charger (transmitter of inductive power) 2 and a portable device (receiver of inductive power) 4.

The charger takes a mains input. This is rectified 6 to produce a DC voltage, which voltage may, optionally, be converted to a different voltage by a DC/DC converter 8. This is then converted to an AC voltage with an inverter 10. The inverter drives a capacitor 12 and magnetic coil 14 pair, to generate by way of the magnetic coil 14 a magnetic field. The frequency of the inverter 10 driving the coil 14 can vary widely depending on the application. It may be as low as tens of kHz or as high as tens of MHz.

Within the portable device 4 there is a coil 16 and capacitor 18 pair, to pick up the AC electromagnetic signal, followed by a rectifier 20 to convert it to a DC signal. This DC power is then delivered to the device's load 22 (which may include all of the device's electronic circuitry). Optionally, DC/DC conversion 24 may be present on the receiver side.

Figure 2:
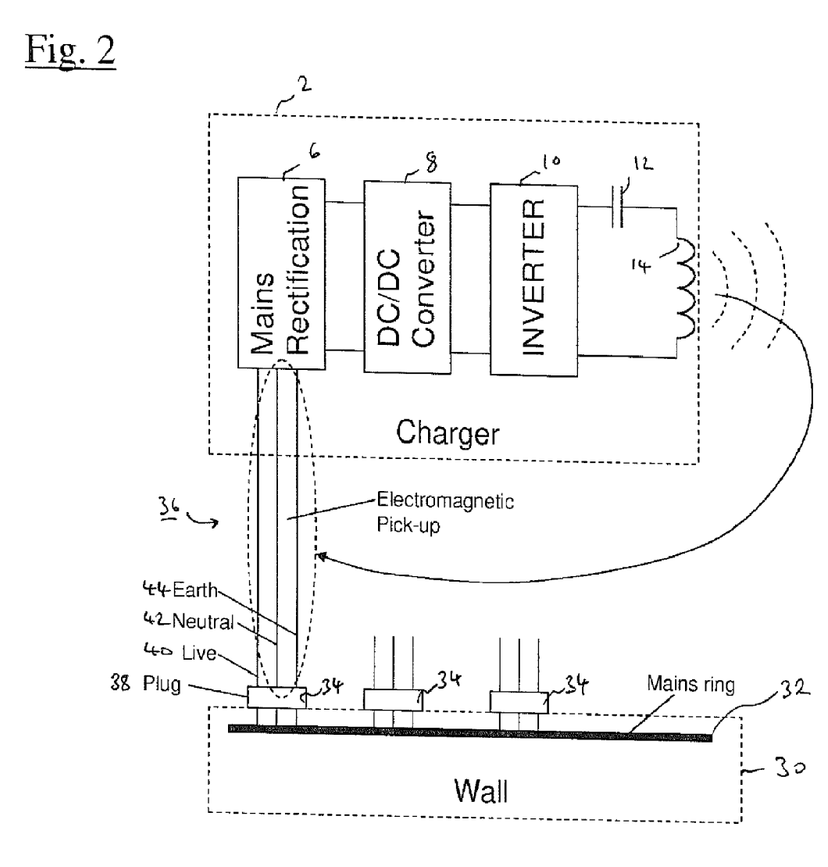
FIG. 2 is a schematic diagram useful for illustrating how the magnetic field emitted by the transmitter of a wireless charging system may be picked up by a mains cable.

FIG. 2 is a schematic diagram useful for illustrating how the magnetic field emitted by the charger coil 14 may be picked up by a mains cable. Charger 2 is depicted as before, with like reference numerals denoting like elements. Consequently, duplicate description is omitted for simplicity.

Mains supply to the charger 2 is shown in detail in FIG. 2. A wall 30 is shown having a mains ring 32 located therein to supply mains power to a number of wall sockets 34. Charger 2 is shown connected to the left-most socket 34 via a conduit 36, such as a mains cable or the like, and a plug 38. Live 40, neutral 42 and earth 44 connections are shown for ease of understanding, however it will be understood that the terminology for such connections may differ from country to country. Indeed, in some countries, or regions, or depending on the type of equipment concerned, it can be the case that no such earth connection is provided.

The coil 14 within the charger 2 cannot be fully shielded since it should couple to a portable device 4 which is brought into proximity with it. It is therefore possible that some of the transmitted radiation is picked up by the mains cable 36. This radiation may then be conducted back through the mains cable 36, through the plug 38 and socket 34 and into the mains ring 32. Such "back conduction" of noise is undesirable.

Figure 3:
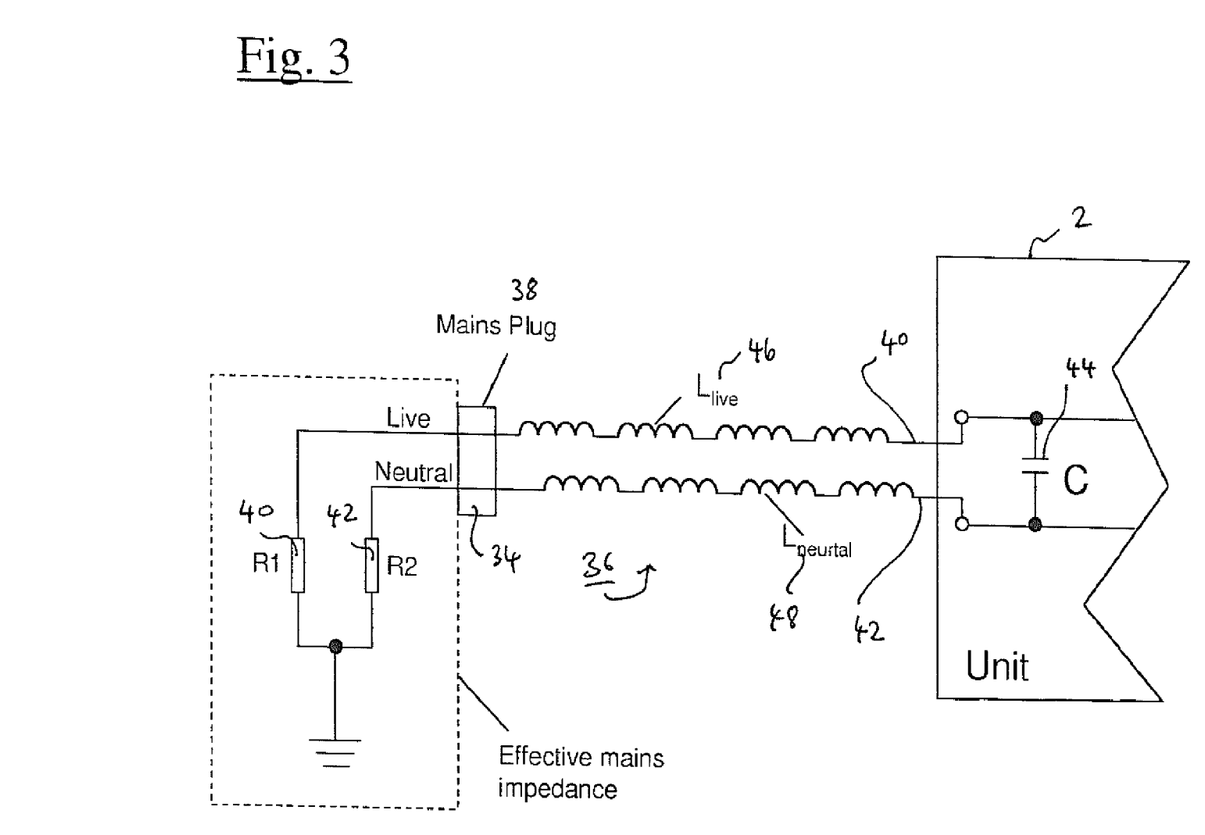
FIG. 3 is a schematic diagram presenting an electrical circuit useful for understanding embodiments of the present invention disclosed herein.

FIG. 3 is a schematic diagram presenting an electrical circuit useful for understanding embodiments of the present invention disclosed herein. In FIG. 3, part of the charger 2 is shown, connected to a mains socket 34 via the cable 36 and plug 38. No earth connection 44 is shown in FIG. 3, however it may of course be present.

The "live" 40 and "neutral" 42 wires of the mains cable 36 each have distributed inductances, the value typically being in the region of 40 nH/m. These may be represented by a series of lumped inductors as shown in FIG. 3. The mains termination itself may be represented by an impedance 40 from live to ground and another impedance 42 from neutral to ground.

As an aside, for EMC testing purposes a Line Impedance Stabilisation Network is typically used. This has filtering to ensure that any tests carried out are not tainted by conducted emissions present in the mains system and also to ensure that the device under test does not transfer emissions into the mains.

Within the charger 2, there may be a capacitor 44 across the live and neutral terminals to suppress noise present on the mains (for example 50/60 Hz) input.

One form of conducted emissions that may be troublesome is differential-mode pick-up in the mains cable 36. This form creates a voltage imbalance between the live 40 and neutral 42 cables or wires at the frequency of the pick-up. One way to view this is to consider the live 40 and neutral 42 wires as a single coil loop. A loop is formed around R1 40, Llive 46 (inductance of the live wire 40), C 44, Lneutral 48 (inductance of the neutral wire 42) and R2 42. When this loop is subject to an alternating magnetic field, a voltage may be induced according to Faraday's law.

Figure 4:
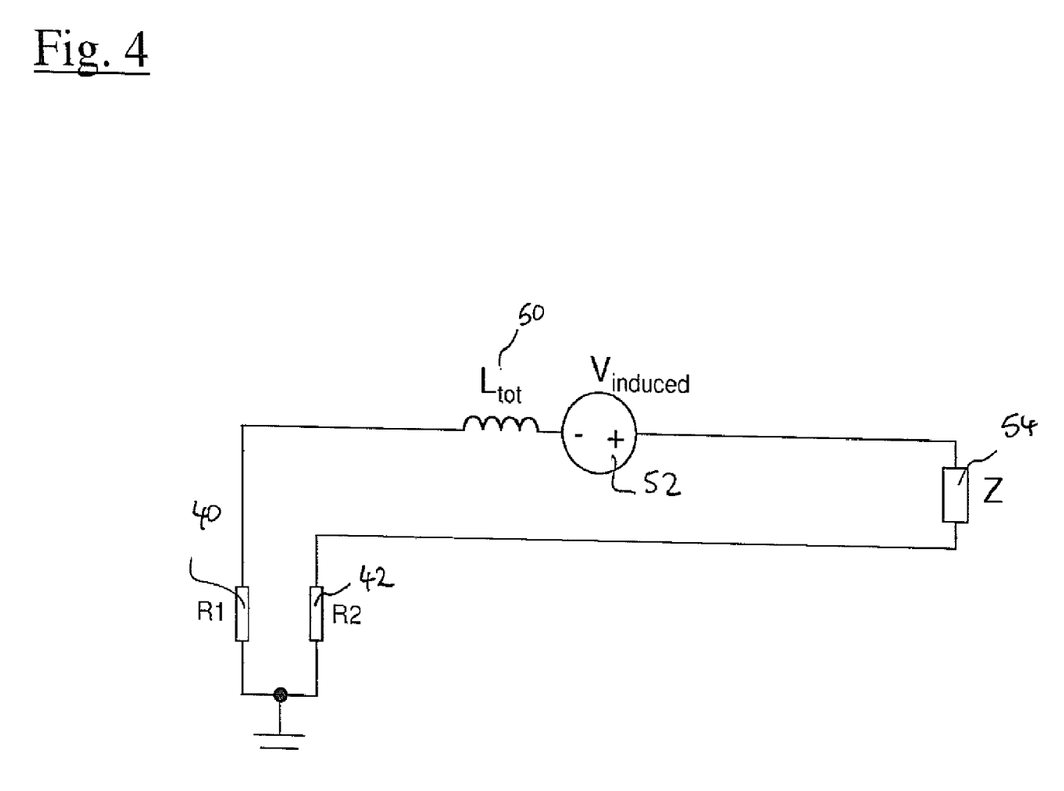
FIG. 4 is a schematic diagram of a simplified equivalent circuit for differential-mode pick-up according to FIG. 3.

A simplified equivalent circuit for differential mode pick-up according to FIG. 3 is shown schematically in FIG. 4.

Across the R1 and R2 terminals, there is an inductance Ltot 50 (representing Llive+Lneutral) a voltage source 52 (representing the induced voltage in the effective coil) and an impedance Z 54 (representing the impedance of the unit or charger 2, including any input capacitance present). The induced voltage will be dropped across all the impedances in the loop, namely Ltot, Z, R1 and R2. Thus, the induced voltages seen across R1 and R2 respectively will be:

$$V_{R1} = (V_{induced})\left(\frac{R1}{Z(\omega) + \omega \cdot L_{tot} + R1 + R2}\right)$$

$$V_{R2} = (V_{induced})\left(\frac{R2}{Z(\omega) + \omega \cdot L_{tot} + R1 + R2}\right)$$

where $\omega = 2\pi f$, and f is the frequency of the signals under observation.

It should be noted that not only will the loop pick up magnetic field at the fundamental frequency f, but also spurious signals, such as the harmonics.

Figure 5:
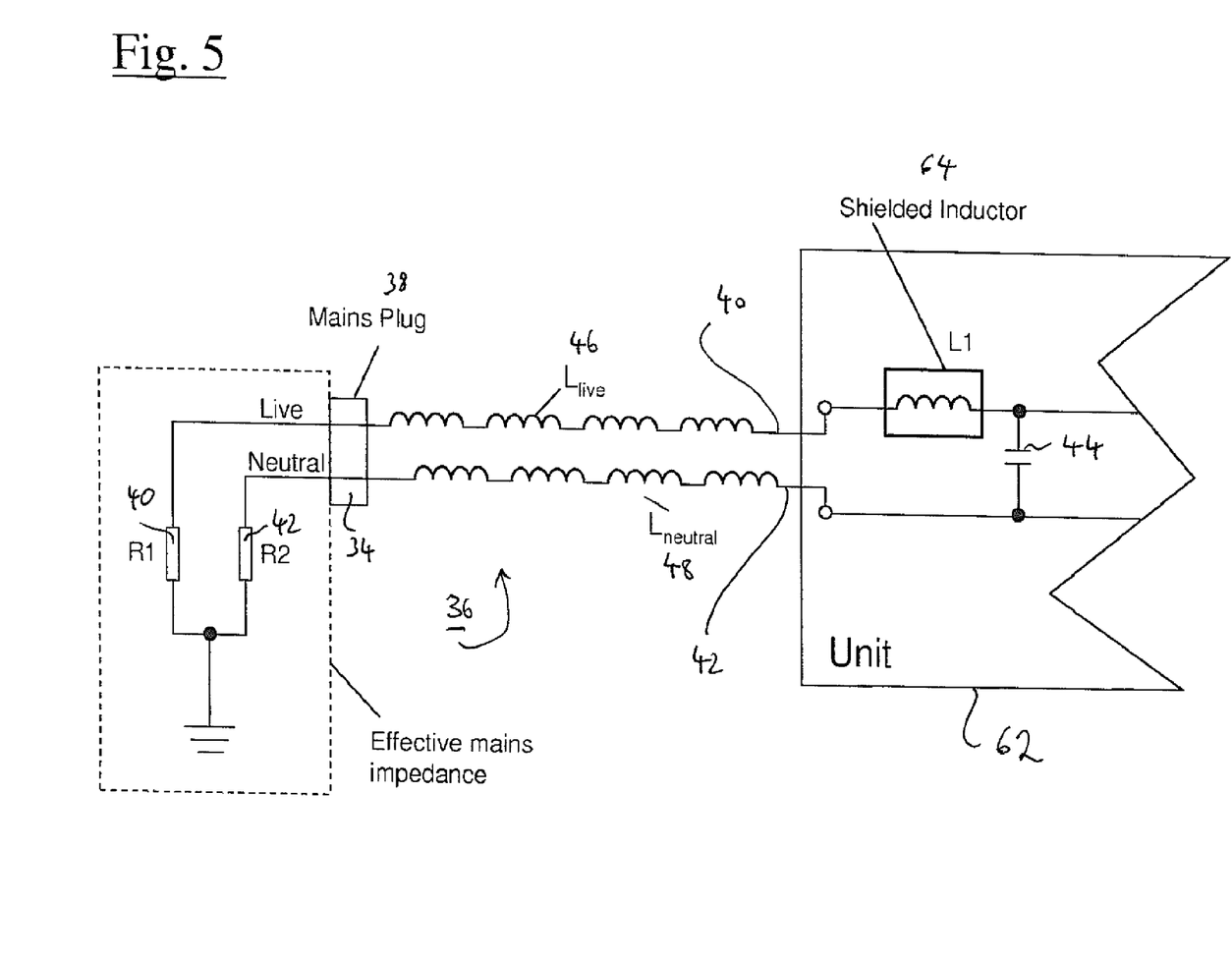
FIG. 5 is a schematic diagram presenting an embodiment of the present invention.

FIG. 5 shows a configuration which embodies the present invention. FIG. 5 is similar to FIG. 3, and therefore like elements are denoted with like reference numerals. The embodiment of FIG. 5 is configured to enable voltages seen across R1 and R2 due to the unwanted emissions to be reduced, thereby reducing the conducted emissions.

The main difference between FIG. 5 and FIG. 3 is that charger 2 is replaced with charger 62 (again, shown in part). Charger 62 comprises an additional component or element L1 64, over charger 2.

The component 64 takes the form of an inductance (e.g. an inductor) in the present embodiment. The value of the inductance may be chosen such that it has a low impedance at the mains frequency (typically 50-60 Hz), but a high impedance at the frequency of the charger's magnetic field. The effect of the inductor 64 on the mains power delivery may therefore, advantageously, be very small. However, voltages induced by the charger's magnetic field may be substantially dropped over the inductor 64.

Figure 6:
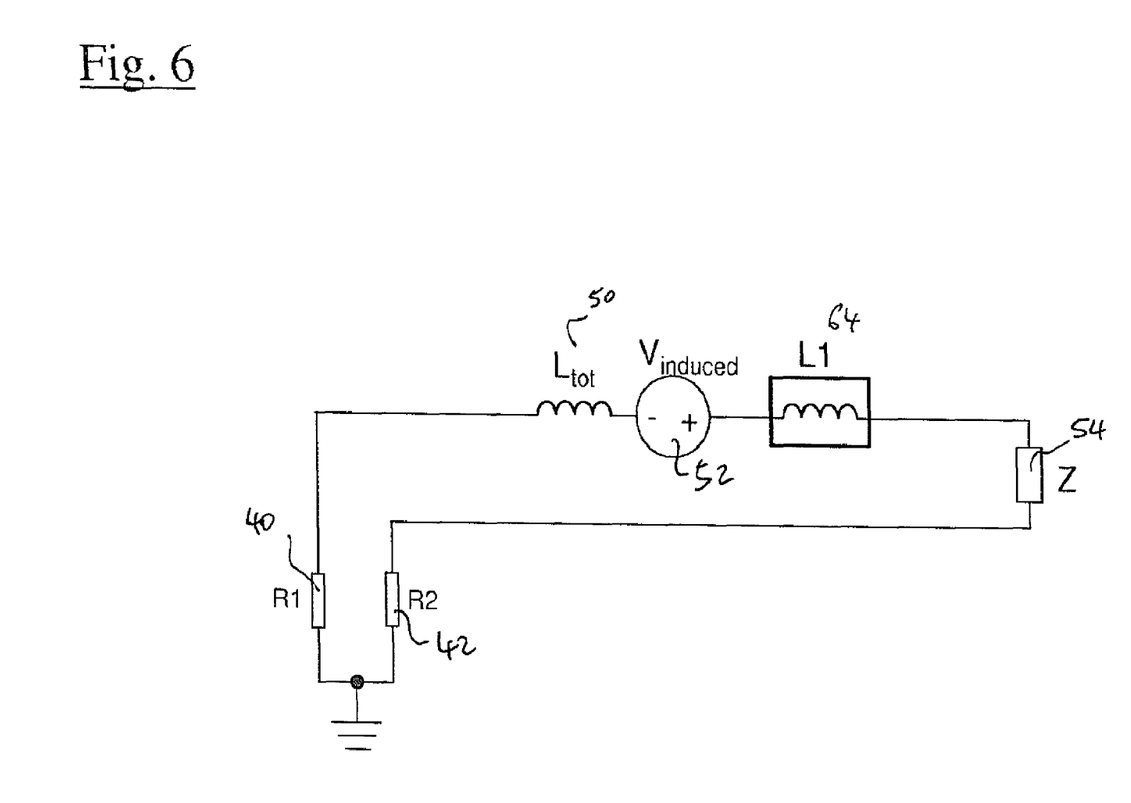
FIG. 6 is a schematic diagram of a simplified equivalent circuit for differential-mode pick-up according to FIG. 5.

Some means may be desirable to prevent (or reduce the effects of) the inductor itself picking up the magnetic field (e.g. an alternating magnetic field) emitted by the coil 14 of the charger (primary unit) or transmitter 62. One way is to shield the inductor 64 by surrounding it in a metal case. The inductor may be within its own shielded case, or within a shielded case among other circuit elements required for the charger 62. Care may be taken such that the inductor does not pick-up stray field from other inductors or current-carrying wires. A simplified equivalent circuit for differential mode pick up according to FIG. 5 is shown schematically in FIG. 6. FIG. 6 is similar to FIG. 4, and therefore like elements are denoted with like reference numerals.

In FIG. 6, the inductor 64, L1, is present. At the frequency of the alternating magnetic field emitted by the coil 14, L1 will introduce significant additional impedance into the loop as compared to that in FIG. 4. The induced voltages seen across R1 and R2 now therefore become:

$$V_{R1} = (V_{induced})\left(\frac{R1}{Z(\omega) + \omega \cdot L_{tot} + \omega \cdot L1 + R1 + R2}\right)$$

$$V_{R2} = (V_{induced})\left(\frac{R2}{Z(\omega) + \omega \cdot L_{tot} + \omega \cdot L1 + R1 + R2}\right)$$

where $\omega = 2\pi f$, and f is the frequency of the signals under observation.

A value of L1=100 uH provides an impedance of 126 ohms at 200 kHz, 63 ohms at 100 kHz, and 0.03 ohms at 50 Hz. This inductance value may be a practical value for implementing an embodiment of the present invention. The values of R1 and R2 may be around 5 ohms, so that a far greater proportion of the induced voltage is dropped across the element.

The effect of the inductor 64 is therefore to reduce these induced voltages seen across R1 and R2, thereby reducing the conducted emissions.

Figure 7:
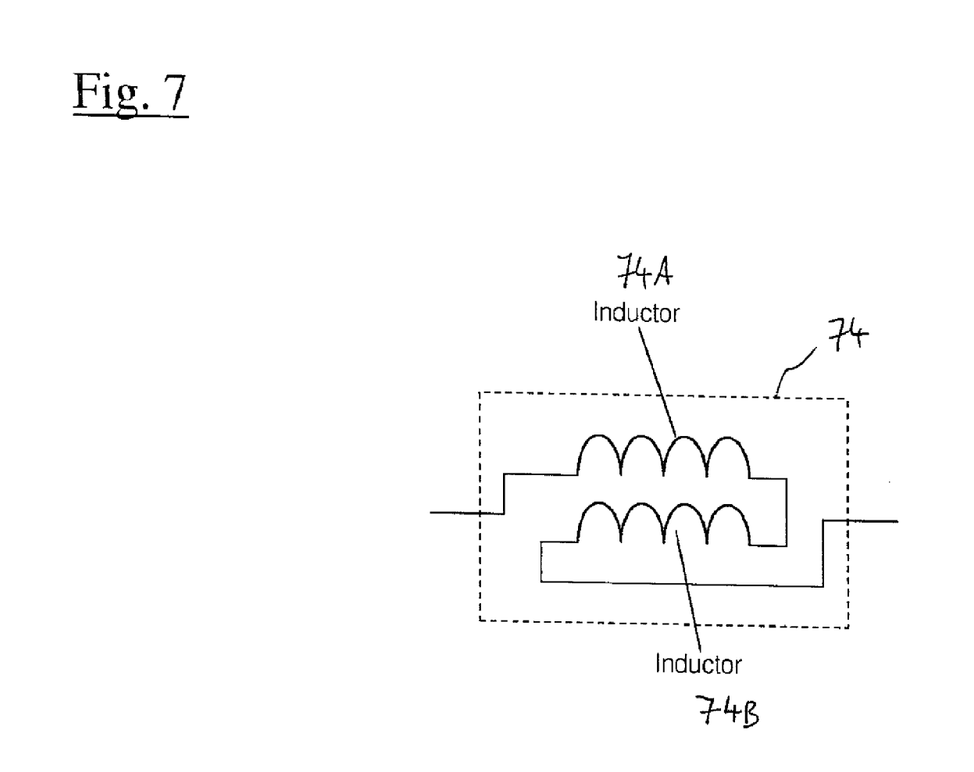
FIG. 7 is a schematic diagram presenting an alternative way of providing an inductor in which the pick-up of stray magnetic fields is mitigated.

FIG. 7 shows an alternative way of providing an inductor 64 in which the pick up of stray magnetic fields is mitigated. FIG. 7 presents an inductor 74 which may be employed in place of, or in addition to, inductor 64.

The inductor 74 has two halves 74A and 74B, connected together in series. The two halves are located such that they are positioned alongside each other and in the same orientation, but so as to avoid coupling between the two halves (e.g. spaced sufficiently far apart, such that there is little coupling). In this configuration, the induced EMF from the pick-up in the first half may be of a similar magnitude and opposite polarity to that of the second half. The two EMFs may therefore substantially oppose one another, such that there is little residual EMF generated across the combination.

Figure 8:
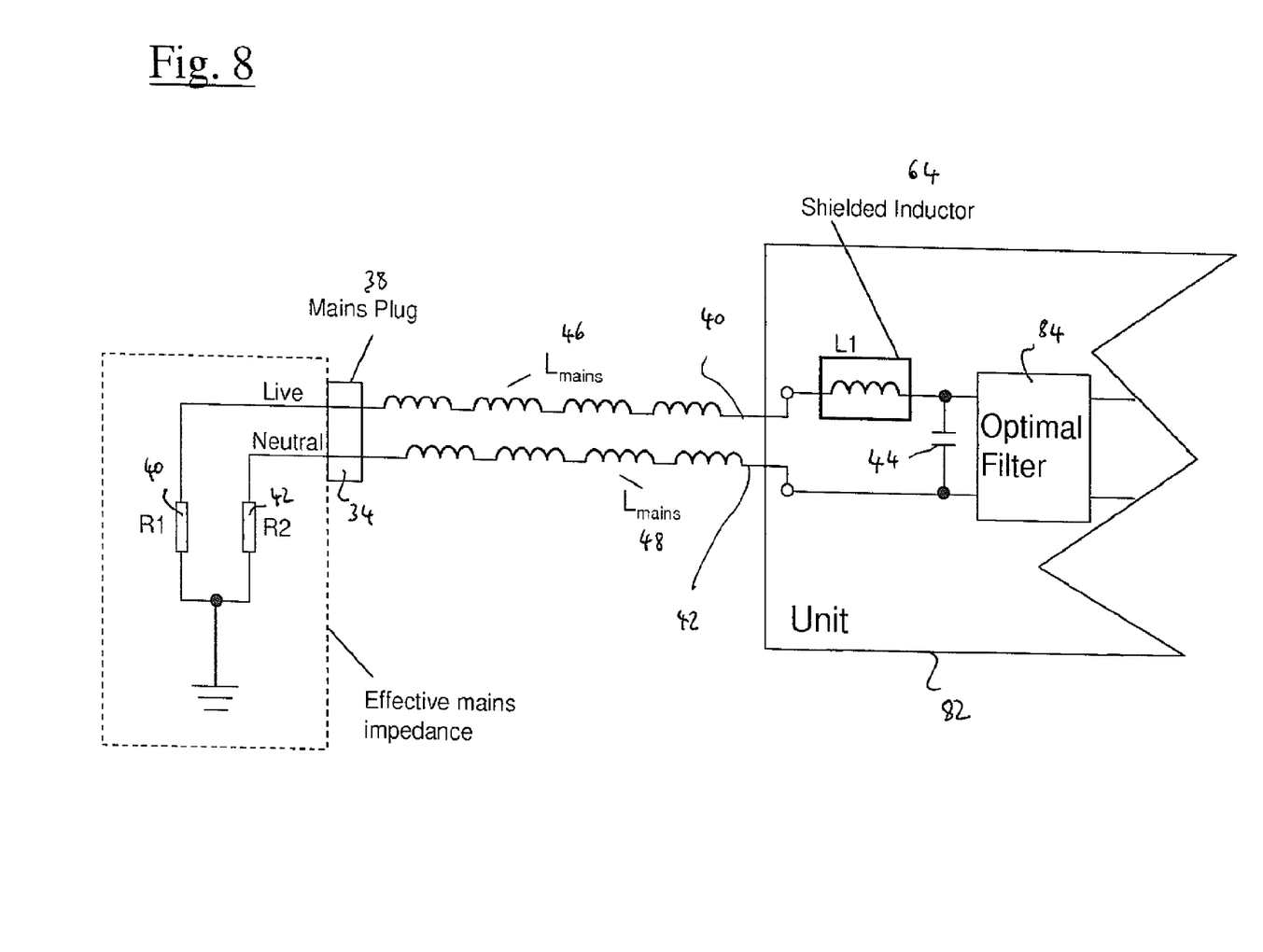
FIG. 8 is a schematic diagram presenting an embodiment of the present invention.

FIG. 8 shows an alternative configuration to that in FIG. 5, again embodying the present invention. FIG. 8 is similar to FIG. 5, and therefore like elements are denoted with like reference numerals.

The main difference between FIG. 8 and FIG. 5 is that charger 62 is replaced with charger 82 (again, shown in part). Charger 82 comprises an additional component 84, over charger 62.

Figure 9:
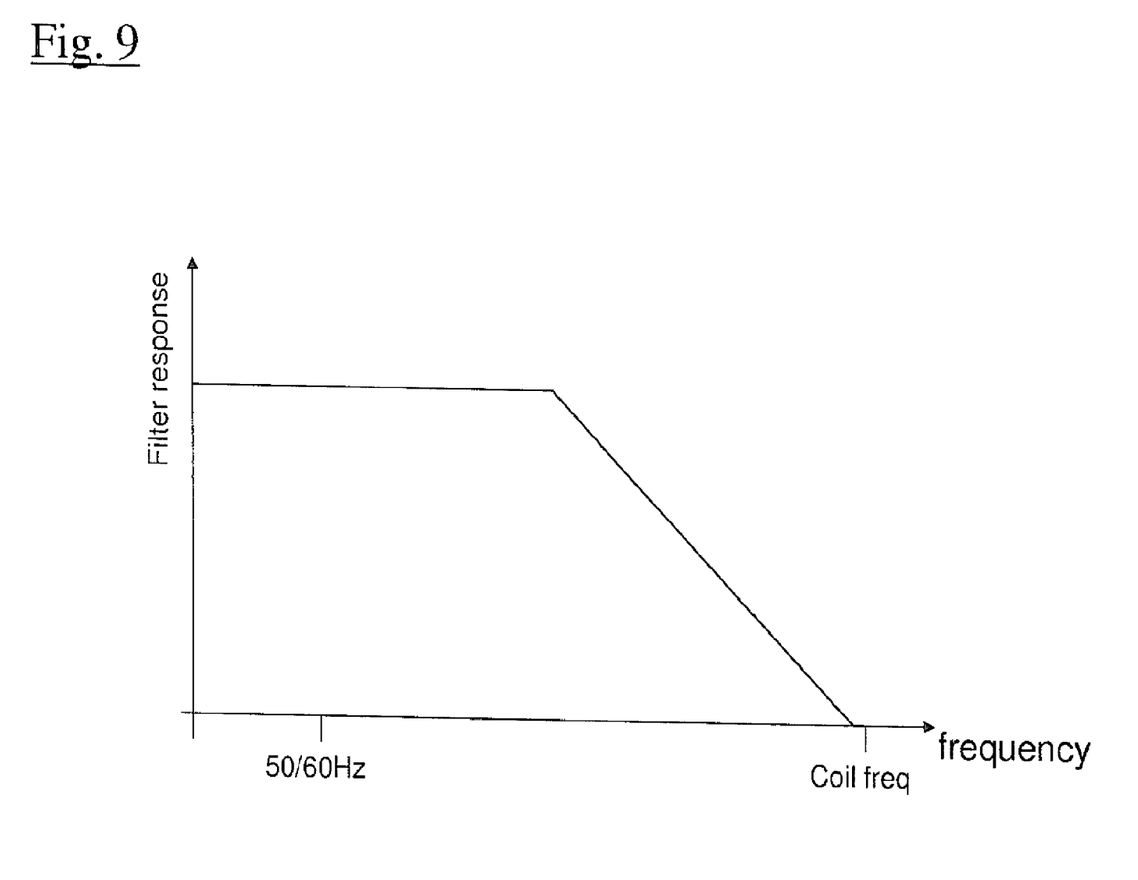
FIG. 9 presents a frequency response of the filter of FIG. 8.

Component 84 is a filter, for example an optimal filter. The optimal filter 84 has a filter response similar to that shown in FIG. 9. This filter therefore allows the mains frequencies (for example 50-60 Hz) to pass, but rejects the typically higher frequencies of the alternating magnetic field.

Figure 10:
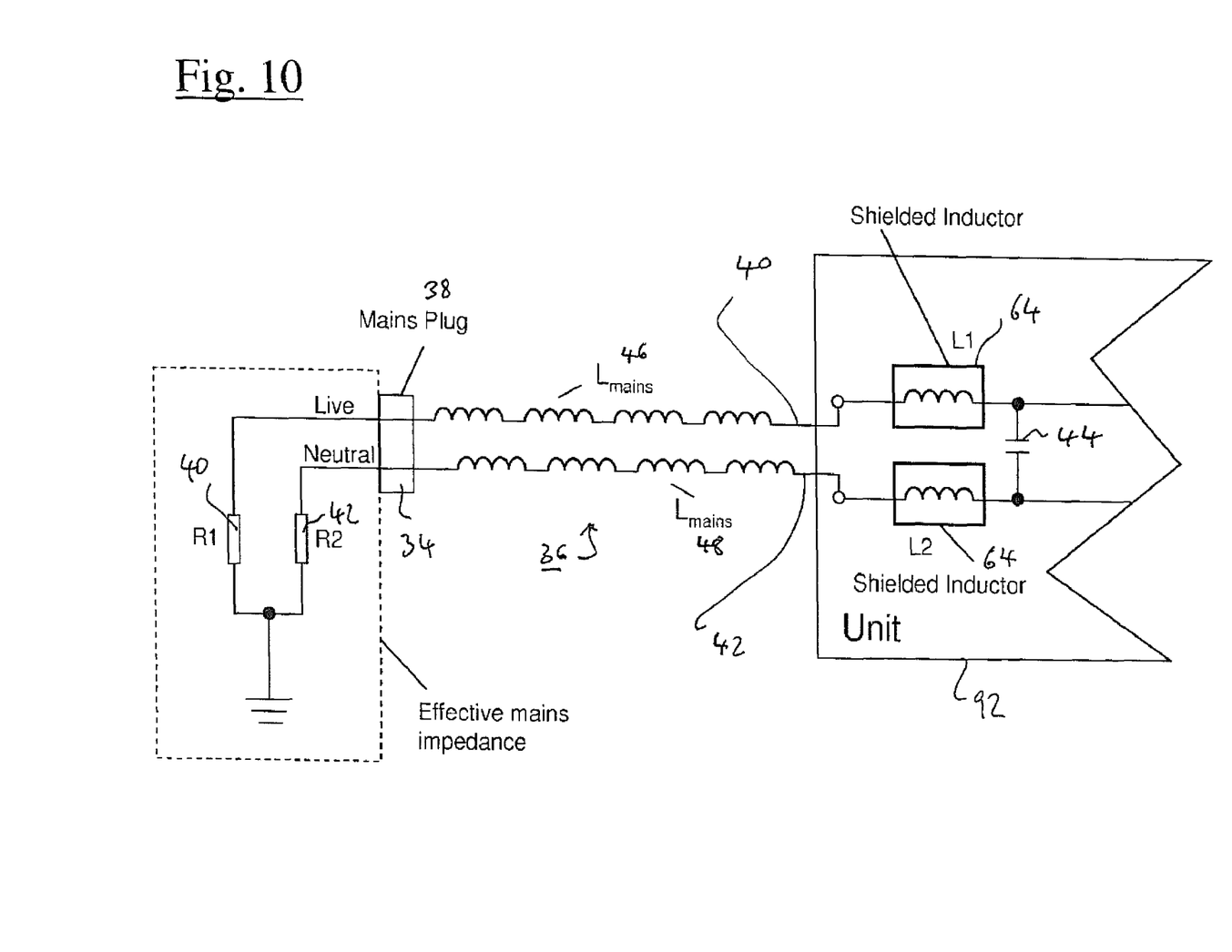
FIG. 10 is a schematic diagram presenting an embodiment of the present invention.

FIG. 10 shows an alternative configuration to that in FIG. 5, again embodying the present invention. FIG. 10 is similar to FIG. 5, and therefore like elements are denoted with like reference numerals. The main difference between FIG. 10 and FIG. 5 is that charger 62 is replaced with charger 92 (again, shown in part).

Charger 92 comprises two additional inductors 64, L1 and L2. The first is between the live terminal and the input capacitor 44 as before. The second is between the neutral terminal and the input capacitor 44. Accordingly, an element 64 is present on both the neutral path and the live path, which may be referred to conveniently as first and second connections (or outbound and return paths in the case of DC current supply).

The FIG. 10 configuration, like the FIG. 5 configuration, may reduce the differential-mode conducted emissions. An advantage of using two inductors in separate lines, rather than a single inductor of twice the value, is that the common-mode conducted emissions may also be reduced. Common-mode pick-up may occur directly from the magnetic field to the distributed inductances in the live and neutral wires, by virtue of weak mutual coupling. A common-mode circuit is formed from ground though R1 and R2, through Llive and Lneutral, through to the unit or charger 92. The circuit in the unit 92 inevitably has some parasitic capacitance to ground, thus completing the circuit.

Figure 11:
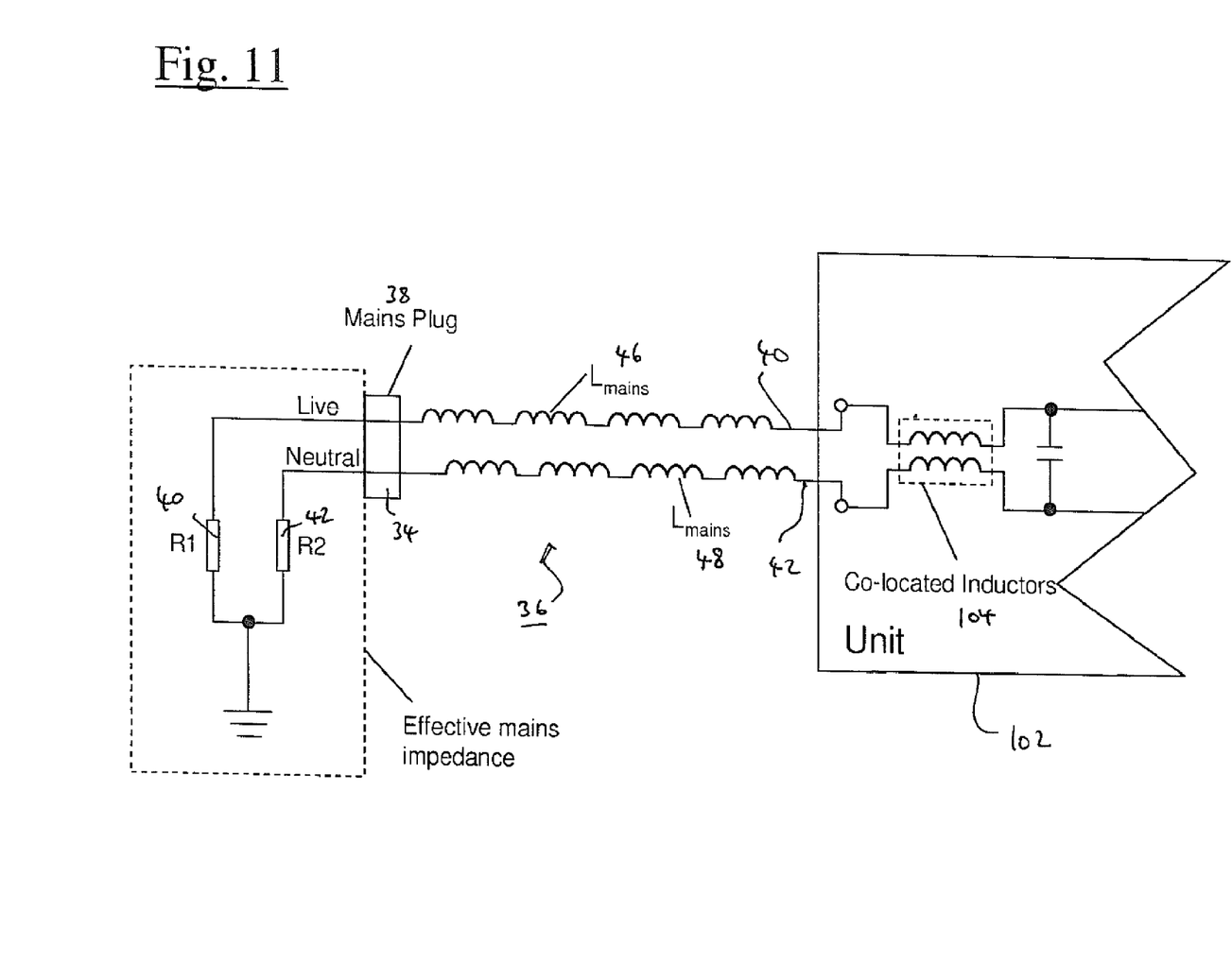
FIG. 11 is a schematic diagram presenting an embodiment of the present invention.

FIG. 11 shows an alternative configuration to that in FIG. 10, again embodying the present invention. FIG. 11 is similar to FIG. 10, and therefore like elements are denoted with like reference numerals. The main difference between FIG. 11 and FIG. 10 is that charger 92 is replaced with charger 102 (again, shown in part).

In FIG. 11, two physically co-located inductors 104 are provided similarly to the two inductors 64 in FIG. 10, one electrically connected to the live terminal and the other electrically connected to the neutral terminal. These inductors are sufficiently close so that they experience the same amount of pick-up. The orientation is such that the induced voltage in one opposes that in the other, so that the differential conducted emissions are reduced.

In embodiments of the invention the elements 64, 74, 104 may be inductors, or a combination of inductors and other components. Those elements may be shielded or unshielded. Such shielding may be dedicated shielding or shielding provided in common to several components.

Although elements 64, 74 and 104 are shown in the embodiments described above as being located in the charger, this location is not essential. Those elements may have a similar effect if located elsewhere in the equivalent circuit, for example in the mains cable 34, the plug 38, or the socket 38. The present invention therefore extends in separate embodiments to a charger/transmitter (without a cable or with a cable), a cable (a conduit), a plug, and a socket, respectively, configured accordingly to have at least one impedance element. The invention also extends to equipment which may be used in the vicinity of such a charger/transmitter. Such equipment may be susceptible to noise pick-up in a similar manner to that described above, and may thus also benefit from the use of impedance elements as described above. Elements 64, 74 and 104 may be provided in a distributed form as apposed to as discrete elements.

Although typical mains electricity frequencies are in the range 50-60 Hz, the present invention applies to other supply frequencies and the above embodiments should be understood accordingly. For example, embodiments of the present invention may be employed in locations where a dedicated, non-public, non-standard, power supply is provided.

In practical embodiments of the present invention, the following values/ranges may be considered typical. Mains frequencies are typically 50 or 60 Hz. It may be desirable to set the value of elements 64, 74, 104, to provide an effective L1 value of around 100 uH. An effective L1 value may, for example, be in the range 50 to 150 uH, depending on the circumstances. Typical values for R1 40, Llive 46, C 44, Lneutral 48, R2 42, and L1 64 may be: Llive=80 nH (for a 2m cable at 40 nH/m), Lneutral=80 nH (for a 2m cable at 40 nH/m), R1=5 ohms, R2=5 ohms and L1=100 uH (as discussed above). The value of C 44 may be dependent on how much capacitance there is between the supply rails, and could be anywhere between, for example, 1 uF and 10 mF. These values are provided merely by way of example.

Additional techniques may be employed in conjunction with those discussed above, to suppress electromagnetic interference. One such technique may involve configuring the field generator in the charger (or transmitter or primary unit) as follows. It will be appreciated, for example from FIG. 1, that such a field generator may comprise a capacitor 12 and coil 14 arrangement.

In one embodiment, the coil 14 may be arranged to have two portions, L1 and L2, connected together. These two coil portions may be strongly coupled together, such that the coupling coefficient between the two is close to (but not quite) 1. L1 may have ends A and B, and L2 may have ends C and D.

In this embodiment, end B is electrically connected to end C. The orientation of the coupling is such that L1 couples along its length in direction AB to L2 along its length in direction CD. Preferably, but not essentially, the midpoint between the coil portions is connected to ground (a DC source voltage). In this arrangement, the resonant capacitor 12 (Cp) is replaced by two series capacitors C1 and C2, such that C1=C2, 2×Cp. Series resonance is maintained between (L1+L2+2M12) and (C1+C2), where M12 is the mutual inductance between L1 and L2. The first capacitor C1 is connected to the first coil portion L1 at point A and the second capacitor C2 is connected to the second coil portion L2 at point D. The opposite ends of the two capacitors C1 and C2 from the coil are connected to the AC voltage source, which in this case may be the inverter 10.

This configuration may be understood as follows. The coil in the present embodiment has two parts L1 and L2, as discussed above. Here, point A experiences a sinusoidal voltage, symmetrical about ground, with peak voltage V1/2 (denoted +V1/2 to be in-phase with the AC voltage source having magnitude V1). Point D has a similar signal, except that the voltage is substantially 180 degrees out of phase with that at point A. Therefore, the peak voltage at point D is denoted −V1/2 as it is out-of-phase with the AC voltage source. During the peak of the positive half cycle of the AC voltage source, the voltage at point A is +V1/2 V and the voltage at point B is −V1/2 V. L1 therefore may induce charge +q/2 and L2 may induce charge −q/2 on an object in the vicinity of the coil arrangement (for example, a metal object or a conduit as discussed above). The net charge induced in the object is accordingly substantially zero (or close thereto). Similarly, at the peak of the negative half cycle of the AC voltage source, L1 induces −q/2 and L2 induces +q/2, such that there is also substantially zero net induced charge.

EMC performance is thus improved because in this arrangement there is both positive and negative charge induced in the object simultaneously, with the result that the net induced charge is substantially zero (or close thereto). A further effect is that the peak voltage relative to ground is halved as compared to that in the arrangement of FIG. 1, reducing the magnitude of charge induced. It is advantageous to connect the midpoint between L1 and L2 to ground, so that the potential does not shift causing a DC offset if the arrangement is not completely balanced.

Accordingly, in a transmitter embodying the first aspect of the present invention discussed above, the field generator may have or comprise a coil and driving means operable to drive a fluctuating current through the coil, wherein both ends of the coil are decoupled from the driving means so that in use a voltage level at each end of the coil fluctuates with time.

Such decoupling may be decoupling in the sense that a non-DC path is provided between each end of the coil and the driving means. Such a path(s) may dominate at a desired frequency of operation over other paths provided.

Such an arrangement leads to a balanced operation of the coil, such that voltage fluctuations at one end of the coil partly or fully compensate for voltage fluctuations at the other end of the coil. In this way, positive and negative charges may be induced in a conductive object, such charges partly or fully cancelling each other out such that reduced noise, due to the electric (electrostatic) field generated by the coil, is suffered by that object.

Both ends of the coil may be capacitively decoupled from the driving means. For example, both ends of the coil may be connected to the driving means via a capacitor. Such an arrangement is a cost-effective and simple way of operating the coil in a balanced or near-balanced fashion. For example, the use of a transformer or a differential output coil driver could add cost and complexity.

Both ends of the coil may be decoupled from any DC source voltage in the transmitter. Both ends of the coil may be decoupled from any DC source voltage present in the transmitter other than along the length of the coil. Such decoupling may be capacitive, for example employing a capacitor as mentioned above. Decoupling the coil from any DC source voltage may assist in the operation of the coil in a balanced or near-balanced fashion. A DC source voltage may however be applied to a point along the coil, for example towards its centre, to assist in balancing the operation around a desired DC voltage level (for example, around a ground or 0 Volts DC level).

The driving means may be an alternating current or voltage source. For example, the driving means may be an alternating voltage source having first and second terminals; and the voltage source may be connected at one of those terminals to a ground source voltage such that it operates as a single-polarity voltage source. Such a voltage source may be implemented as an inverter.

The coil may comprise first and second coil portions; and the first and second coil portions may be configured such that they are magnetically coupled to one another. The first coil portion may have a first end and a second end, the second coil portion may have a third end and a fourth end, and the second and third ends may be connected together such that the first and fourth ends form the ends of the coil. A coupling coefficient between the first and second coil portions may be greater than 0.5 and, optionally within the range 0.9 to 1. For example, the coupling coefficient may be in the range 0.94 to 0.96.

The first and second coil portions may be configured such that coupling takes place from the first portion, in the direction from the first end to the second end, to the second portion, in the direction from the third end to the fourth end. This may be achieved by winding both portions around a core from the same end (starting with the first and third ends), or for example placing the two portions together (with the first and third ends together, and the second and fourth ends together) and arranging them in a desired pattern (for example, in a spiral) together. The coil may be configured such that windings (e.g. all of them) of one of said portions overlap or run alongside windings (e.g. all of them) of the other one of said portions. A direction of winding of the first portion, from the first end to the second end, may thus be the same as a direction of winding of the second portion, from the third end to the fourth end.

A DC source voltage such as a ground source voltage may be connected to the coil between said first and second coil portions. This may assist in balancing the operation of the coil around a desired DC voltage level (for example, around a ground or 0 Volts DC level). A varying source voltage may be used instead of the DC source voltage, however such variance may affect the balance achieved.

The first and second coil portions may be substantially similar to one another. For example they may have the same physical and/or electrical properties. For example, they may have the same inductance as one another. As another example, they may be made of the same material as one another, have the same length and cross-section as one another, and have the same number of turns as one another. The coil portions may be parts of a single coil structure, or they may be distinct coil structures, electrically connected together.

The first coil portion may be a driven portion, configured to be driven by said driving means, and the second coil portion may be a passive portion, configured to be undriven by said driving means. The transmitter may be configured such that in use the first coil portion drives the second coil portion by way of magnetic coupling between the first and second coil portions. The second coil portion may be considered to be a passive portion for example if the ends of that portion are connected to the same or different DC source voltage(s).

The transmitter may be configured such that fluctuations in an effective instantaneous coil voltage, the effective instantaneous coil voltage being the sum of the instantaneous voltages at opposite ends of the coil, have magnitudes substantially smaller than that of fluctuations of a voltage over the coil. The effective instantaneous coil voltage may be substantially constant or stable over time. The effective instantaneous coil voltage may fluctuate closely around or be stably at a ground voltage over time.

The transmitter may be configured such that fluctuations in voltage level at one end of the coil are substantially out of phase (e.g. by 180°) with fluctuations in voltage level at the other end of the coil.

The transmitter may be configured such that, when a voltage level at one end of the coil fluctuates positively away from a ground voltage, a corresponding negative voltage fluctuation is experienced at the other end of the coil. The transmitter may be configured such that voltage signals at the two ends of the coil would if summed exhibit destructive interference. Such a relationship between the coil portions (i.e. one portion cancelling out to some extent the effect of the other in terms of the electric field generated) may be true along the length of the coil.

The invention claimed is:

1. An electrical conduit configured to convey power conductively by way of a current from a power source to a field generator of an inductive power transmitter, the field generator being operable to generate a fluctuating electromagnetic field having a fundamental frequency for transmitting electrical power to a device by electromagnetic induction, the conduit comprising:

at least one impedance element connected along an electrical path of the conduit configured to carry said current, the at least one impedance element having a high enough impedance at the fundamental frequency such that, in use, electromagnetic noise experienced at the power source is substantially suppressed, such electromagnetic noise arising from coupling between the electromagnetic field and a circuit having said path and linking the power source to the transmitter, wherein the at least one impedance element includes first and second inductors, wherein a voltage induced by the field generator in the first inductor opposes a voltage induced by the field generator in the second inductor.

2. The electrical conduit of claim 1, wherein:
said fundamental frequency is a first fundamental frequency;
said current has a second fundamental frequency different from said first fundamental frequency; and
the at least one impedance element has a low enough impedance at the second fundamental frequency such that the power is predominantly conveyed to the field generator without loss in that impedance.

3. The electrical conduit of claim 1 wherein the electrical conduit is a detachable from the field generator.

4. The electrical conduit of claim 1 wherein the at least one impedance element is shielded from the electromagnetic field.

5. The electrical conduit of claim 1 wherein the first and second inductors are located along side each other and are electrically connected in series.

6. The electrical conduit of claim 1 wherein an induced EMF in the first inductor is of an opposite polarity than an induced EMF in the second inductor.

7. An electrical conduit for electrical connection between a mains supply and an inductive power transmitter, the electrical conduit comprising:
an electrical path adapted to convey power from the mains supply to the inductive power transmitter; and
an impedance element in the electrical path, the impedance element including first and second inductors, wherein a voltage induced by the inductive power transmitter in the first inductor opposes a voltage induced by the inductive power transmitter in the second inductor, and wherein the impedance element includes an impedance such that a back conduction of electromagnetic noise from the inductive power transmitter to the mains supply is suppressed.

8. The electrical conduit of claim 7 wherein the inductive power transmitter is adapted to generate an electromagnetic field at a first frequency, and wherein the impedance of the inductor at the first frequency is selected to suppress electromagnetic noise from the inductive power transmitter to the mains supply.

9. The electrical conduit of claim 8 wherein the mains supply provides electrical power at a second frequency less than the first frequency of the electromagnetic field, and wherein the impedance of the inductor at the second frequency is selected to permit the transfer of electrical power to the inductive power transmitter.

10. The electrical conduit of claim 7 wherein the first and second inductors are located along side each other.

11. The electrical conduit of claim 7 wherein the first and second inductors are electrically connected in series.

12. The electrical conduit of claim 7 wherein an induced EMF in the first inductor is substantially similar to the magnitude of an induced EMF in the second inductor.

13. The electrical conduit of claim 7 wherein an induced EMF in the first inductor is of an opposite polarity than an induced EMF in the second inductor.

14. The electrical conduit of claim 7 further including electromagnetic shielding along the electrical path.

15. The electrical conduit of claim 7 wherein the electrical conduit is detachable from the inductive power transmitter.

16. Equipment for use in the vicinity of an inductive power transmitter, the transmitter being configured to transmit electrical power to a device by electromagnetic induction and comprising a field generator configured to generate a fluctuating electromagnetic field and having a fundamental frequency, the equipment being configured to receive power conductively by way of a current via an electrical conduit from an external power source, the equipment comprising:
an impedance element connected along an electrical path of the equipment configured to carry said current, the impedance element having a high enough impedance at the fundamental frequency such that, in use, electromagnetic noise experienced at the power source is substantially suppressed, such noise arising from coupling between the electromagnetic field and a circuit having said path and linking the power source to the equipment, wherein the impedance element includes first and second inductors, and wherein a voltage induced by the field generator in the first inductor opposes a voltage induced by the field generator in the second inductor.

17. The equipment of claim 16, wherein:
said fundamental frequency is a first fundamental frequency;
said current has a second fundamental frequency different from said first fundamental frequency; and
the impedance element has a low enough impedance at the second fundamental frequency such that the power is predominantly conveyed to the field generator without loss in that impedance.

18. The equipment of claim 16 wherein the at least one impedance element is shielded from the electromagnetic field.

19. The equipment of claim 16 wherein the first and second inductors are located along side each other and are electrically connected in series.

20. The equipment of claim 16 wherein an induced EMF in the first inductor is of an opposite polarity than an induced EMF in the second inductor.

* * * * *